US006849134B2

(12) United States Patent
Henley et al.

(10) Patent No.: US 6,849,134 B2
(45) Date of Patent: Feb. 1, 2005

(54) MINIMUM VOLUME OVEN FOR PRODUCING UNIFORM PYROLYTIC OXIDE COATINGS ON CAPACITOR ANODES

(75) Inventors: John D. Henley, Six Mile, SC (US); Brian J. Melody, Greer, SC (US); John T. Kinard, Greer, SC (US); Randolph S. Hahn, Simpsonville, SC (US)

(73) Assignee: Kemet Electronics Corporation, Greenville, SC (US)

( * ) Notice: Subject to any disclaimer, the term of this patent is extended or adjusted under 35 U.S.C. 154(b) by 204 days.

(21) Appl. No.: 09/948,717

(22) Filed: Sep. 10, 2001

(65) Prior Publication Data

US 2003/0103871 A1 Jun. 5, 2003

(51) Int. Cl.[7] ........................ C23C 16/40; C23C 16/48; C23F 1/00; H01L 21/306

(52) U.S. Cl. ....................... 118/718; 118/719; 118/720; 118/724; 118/729; 156/345.31; 156/345.54

(58) Field of Search ................................ 118/715, 728, 118/50, 718, 719; 156/345.29, 345.33, 345.34, 345.35, 345.36, 345.26, 345.51, 345.31; 137/262–264, 454.2, 560, 561 R, 561 A, 571–576, 590, 594–596, 599

(56) References Cited

U.S. PATENT DOCUMENTS

| | | | | | |
|---|---|---|---|---|---|
| 4,038,159 | A | | 7/1977 | Nishino et al. | 205/200 |
| 4,042,420 | A | | 8/1977 | Nishino et al. | 148/272 |
| 4,105,513 | A | | 8/1978 | Nishino et al. | 205/50 |
| 4,123,211 | A | * | 10/1978 | Rudloff | 425/82.1 |
| 4,148,131 | A | | 4/1979 | Nishino et al. | 29/25.03 |
| 4,164,455 | A | | 8/1979 | Aronson et al. | 205/200 |
| 4,260,371 | A | * | 4/1981 | O'ffill | 432/82 |
| 4,492,041 | A | * | 1/1985 | Mansour | 34/406 |
| 4,492,181 | A | * | 1/1985 | Ovshinsky et al. | 118/718 |
| 4,517,448 | A | * | 5/1985 | Crain et al. | 219/388 |
| 4,557,733 | A | * | 12/1985 | Smith et al. | 44/568 |
| 5,365,752 | A | * | 11/1994 | Coffre | 62/374 |
| 5,522,238 | A | * | 6/1996 | Miller | 62/374 |
| 5,622,746 | A | | 4/1997 | Hahn et al. | 427/79 |

OTHER PUBLICATIONS

Fan Handbook Selection Application and Design, Frank P. Bleier, 1997, pp. 13.1–13.4.

J. Electrochem, Society: Electromechanical Science, Jul. 1970, vol 117, No. 7, pp. 854–858.

Randy Hahn, et al., Capacitor and Resistor Technology Symposium, Cart '98, Mar. 9–13, 1998, pp. 129–133.

The Electromechanical Society, Inc., Manganese Dioxide Symposium, vol. 2, Tokyo, 1980, pp. 305–320.

* cited by examiner

*Primary Examiner*—Rudy Zervigon
(74) *Attorney, Agent, or Firm*—Banner & Witcoff Ltd.

(57) ABSTRACT

A pyrolysis oven provides uniform pyrolytic coatings on capacitor anodes. An oven chamber contains cross-flow blowers situated to provide uniform laminar flow of oven atmosphere over the objects to be treated. The top and side walls of the chamber meet in an inverted V such that when the blower operate, a vortex is created in the inverted V in the chamber.

14 Claims, 2 Drawing Sheets

MINIMUM VOLUME OVEN FOR PRODUCING UNIFORM PYROLYTIC OXIDE COATINGS ON CAPACITOR ANODES

FIELD OF THE INVENTION

The invention relates to a minimum volume oven having a heating zone with uniform laminar oven atmosphere flow for economically thermally treating objects.

BACKGROUND OF THE INVENTION

Solid tantalum capacitors were introduced in the 1950's, and since that time such devices have replaced many of the liquid electrolyte-containing aluminum electrolytic capacitors of similar rating used in the fabrication of electronic circuits. Solid tantalum capacitors have higher capacitance per unit volume, lower equivalent series resistance, lower temperature dependence of capacitance and equivalent series resistance, and higher reliability than the liquid electrolyte aluminum capacitors.

The high capacitance per unit volume of solid tantalum capacitors is a function of the high surface area tantalum powder used to fabricate the powder metallurgy compacts making up the anodes of electronic devices and is also a function of the high dielectric constant of the anodic oxide dielectric film. The high reliability of solid tantalum capacitors is a function of the high stability of the anodic tantalum oxide dielectric layer applied to each sintered powder metallurgy tantalum compact via an anodizing process step. The low equivalent series resistance and small temperature dependence of capacitance and equivalent series resistance are largely a function of the manganese dioxide cathode material used in the fabrication of these devices.

The manganese dioxide cathode material in solid tantalum capacitors is produced in situ via pyrolysis of manganese nitrate solution introduced into the powder metallurgy anode bodies by a dipping step prior to the pyrolysis step. The manganese nitrate dipping and pyrolysis sequence is repeated until the pore structure is sufficiently coated with manganese dioxide.

After the application of the manganese dioxide cathode material to the sintered and anodized powder metallurgy tantalum anode compacts is complete, the compacts are coated with carbon and silver paint, then assembled into finished devices. The finished devices may be on the leaded (hermetically-sealed metal can, molded, or fluidized bed epoxy coated) or surface mount (molded or conformally resin coated) configuration.

Manganese dioxide is a complex substance having many crystal forms, hydration states, and crystal densities. In addition to the above variables, manganese dioxide produced via pyrolysis of manganese nitrate solutions is of varying porosity and surface smoothness depending upon pyrolysis conditions. The focus of a good deal of the development work conducted in the field of solid tantalum capacitors has been the production of manganese dioxide coatings which are dense, adherent, and highly electrically conductive.

Early in the development of solid tantalum capacitors, it was recognized that carrying out the pyrolysis process in the presence of steam gives rise to smoother, denser, and more electrically conductive manganese dioxide than when the pyrolysis is carried out in air. A denser, smoother, and more conformal manganese dioxide coating can be obtained with pyrolysis carried out in an essentially steam atmosphere.

Prior to the development of steam atmosphere pyrolysis, the manganese dioxide pyrolytic coatings on tantalum capacitors produced in air were sufficiently non-uniform to require mechanical sizing, such as by external grinding, prior to fabrication of the finished devices.

It was discovered that confining the pyrolysis reaction gases in close proximity to the manganese nitrate coated substrate gives rise to the production of manganese dioxide having higher density and conductivity than manganese dioxide produced in an atmosphere of air or steam alone ("Electrical Properties of Manganese Dioxide and Manganese Sesquioxide", by Peter Klose, Journal of the Electrochemical Society, Vol. 117, No. 7, pages 854–858). Others made use of this effect, i.e., the improvement in manganese dioxide density and conductivity when the pyrolysis gases are confined in close proximity to the reaction mass, to produce tantalum capacitors having improved electrical parameters (lower leakage current and dissipation factor, higher capacitance) by confining the manganese nitrate solution-dipped anodes within small radiant ovens having a small degree of positive pressure, with or without horizontal circulation of the oven atmosphere. See U.S. Pat. Nos. 4,038,159, 4,042,420, 4,105,513, and 4,148,131; also described by Nishino, et. al., at the Manganese Dioxide Symposium, 1980, Tokyo, published by The Electrochemical Society, 1981, *Symposium Proceedings*, pages 305–320.

Confining decomposition gases from manganous nitrate pyrolysis (mainly nitrogen dioxide and steam) in close proximity to manganese nitrate solution-dipped anodes in order to obtain improved pyrolytic manganese dioxide properties has several drawbacks under manufacturing conditions. In order to obtain uniform results, the pyrolysis oven must be loaded with the same number of anodes of the same size containing the same amount of the same concentration of manganous nitrate. However, it is very desirable to be able to vary the number and size of the anodes undergoing pyrolysis in order to meet manufacturing demands.

Aronson, et. al., U.S. Pat. No. 4,164,455, reasoned, because the major nitrogen-containing species evolved during manganese nitrate pyrolysis is nitrogen dioxide, that this is the material responsible for the results obtained in Klose's experiments and Nishino's pyrolysis process. Aronson found similar results could be obtained by employing a small-volume oven into which is introduced a stream of nitrogen dioxide as well as steam. The introduction of nitrogen dioxide as well as into the oven would seem to free the process from a dependence upon loading uniformity from pyrolysis run to pyrolysis run in order to obtain uniform pyrolytic manganese dioxide properties.

A series of experiments indicated that gaseous oxidizing agents more oxidizing than nitrogen dioxide, such as nitric acid, hydrogen peroxide/nitric acid mixtures, and ozone, are significantly more effective than nitrogen dioxide in facilitating the production of the higher density, higher electrical conductivity beta crystal form of manganese dioxide associated with superior electrical performance in the finished solid capacitors (U.S. Pat. No. 5,622,746, and "A Process For Producing Low ESR Solid Tantalum Capacitors", by Randy Hahn and Brian Melody, presented at The 15th Annual Capacitor and Resistor Technology Symposium, Mar. 11, 1998, *Symposium Proceedings*, pages 129–133). The oxidizing agent(s) may be present at relatively low concentrations, e.g. 1–2% of ozone, to 50% or more of the oven atmosphere.

The oxidizing agents employed by Hahn tend to be expensive and corrosive (nitric acid) as well as unstable at pyrolysis temperatures (hydrogen peroxide, ozone). The instability of these reagents makes frequent oven atmosphere turnover necessary in order to maintain the most favorable conditions for high density/high conductivity manganese dioxide production, while the expense of these materials mandates minimal oven size for economic process operation, i.e., a 50% reduction in oven volume for the same oven capacity, in terms of anodes processed in a batch, results in a 50% savings of oxidizing agent and steam consumed per part processed.

Oven size (volume versus anode capacity) is not the only consideration in oven design. Circulating air ovens have been found to offer several advantages over non-circulating radiant ovens for the processing of tantalum anodes through the manganese nitrate pyrolysis process. Circulating air (circulating atmosphere) ovens are more readily maintained at uniform temperature than non-circulating ovens. Circulating air ovens heat the anodes more rapidly than radiant ovens maintained at the same temperature. Atmospheric doping and composition control is more easily accomplished with a circulating atmosphere oven than with a radiant oven.

Applying manganese dioxide to tantalum powder metallurgy anodes provided a decided advantage for pyrolysis ovens having top-down air flow. Top-down air flow dries the tops of the anodes, which are suspended from bars held in a horizontal rack (process lid) faster than the lower portions of the anodes, resulting in liquid phase material being transported to the tops of the anodes by capillary action, counterbalancing the tendency for the liquid manganese nitrate solution to migrate to the lower portions of the anodes due to the action of gravity. The overall result is the production of more uniform manganese dioxide coatings in top-down circulating air pyrolysis ovens.

In order to direct the airflow inside of circulating air process ovens, conventional ovens contain ducts, baffles, and plenums through which the oven atmosphere flows under the impetus of a motorized fan or fans contained within the ductwork. One of the most difficult goals to accomplish in circulating atmosphere oven design is the production of uniform and laminar flow of the oven atmosphere past the objects to be heated, which are contained within the main chamber of the oven during use. In order to render the atmospheric flow uniform across the entire load within an oven, oven manufacturers employ expensive plenums, stacked diffusion screens, and multiple blowers in oven construction. One consequence of using extensive plenums and diffusion screen stacks, etc., is that the volume of the oven atmosphere is many times larger than the volume of the parts being processed. The resulting large size and cost of circulating atmosphere ovens are disadvantageous for the user of these devices. The large volume, associated with the ducting and plenums employed in conventionally designed ovens, also necessitates the use of a relatively large amount of atmospheric doping chemicals for applications such as the manufacture of tantalum capacitors.

What is desired, then, is a circulating process oven designed and fabricated so as to facilitate laminar and uniform atmospheric flow within the oven without the need for the large volume of ducting, plenums, and diffusion screens required to produce uniform oven atmosphere circulation in ovens atmosphere circulation in ovens of conventional design in order to minimize the parasitic oven volume such as ducting, plenums, diffusion screens, etc. versus the useful oven volume in which the load resides during processing.

BRIEF SUMMARY OF THE INVENTION

In a first embodiment, a pyrolysis oven comprises a chamber formed by a top, a bottom, a first side wall, a second side wall, an entrance wall and an exit wall, wherein the top and at least the first side wall meet in an inverted V shape, wherein the oven further comprises at least a first cross-flow blower situated at the bottom of the chamber adjacent the first side wall such that when the cross-flow blower operates, at least a first flow of air flows up the first side wall of the chamber and meets a first vortex created in the first inverted V which first vortex forces the first flow of air over the objects to be treated.

In a preferred embodiment, the top and first side wall meet in a first inverted V shape and the top and second side wall meet in a second inverted V shape, wherein the chamber comprises first and second cross-flow blowers, the first blower located in the bottom of the chamber adjacent the first side wall and the second blower located in the bottom of the chamber adjacent the second side wall such that when the cross-flow blowers operate, a first flow of air flows up the inside of the first side wall and meets a first vortex created in the first inverted V which first vortex forces the first flow of air over the objects to be treated and a second flow of air flows up the inside of the second side wall of the chamber and meets a second vortex created in the second inverted V which second vortex forces the second flow of air over the objects to be treated.

The invention is also directed to a method for treating objects in the pyrolysis oven described above.

DETAILED DESCRIPTION OF THE INVENTION

It was discovered that a pyrolysis oven having a cross-flow blower in the oven chamber produces uniform, laminar oven atmosphere flow over the objects to be treated in the oven. The oven provides uniform atmospheric flow past a high aspect ratio (near planar) load with a minimum of parasitic oven volume compared with the active or load oven volume.

Figure 1:
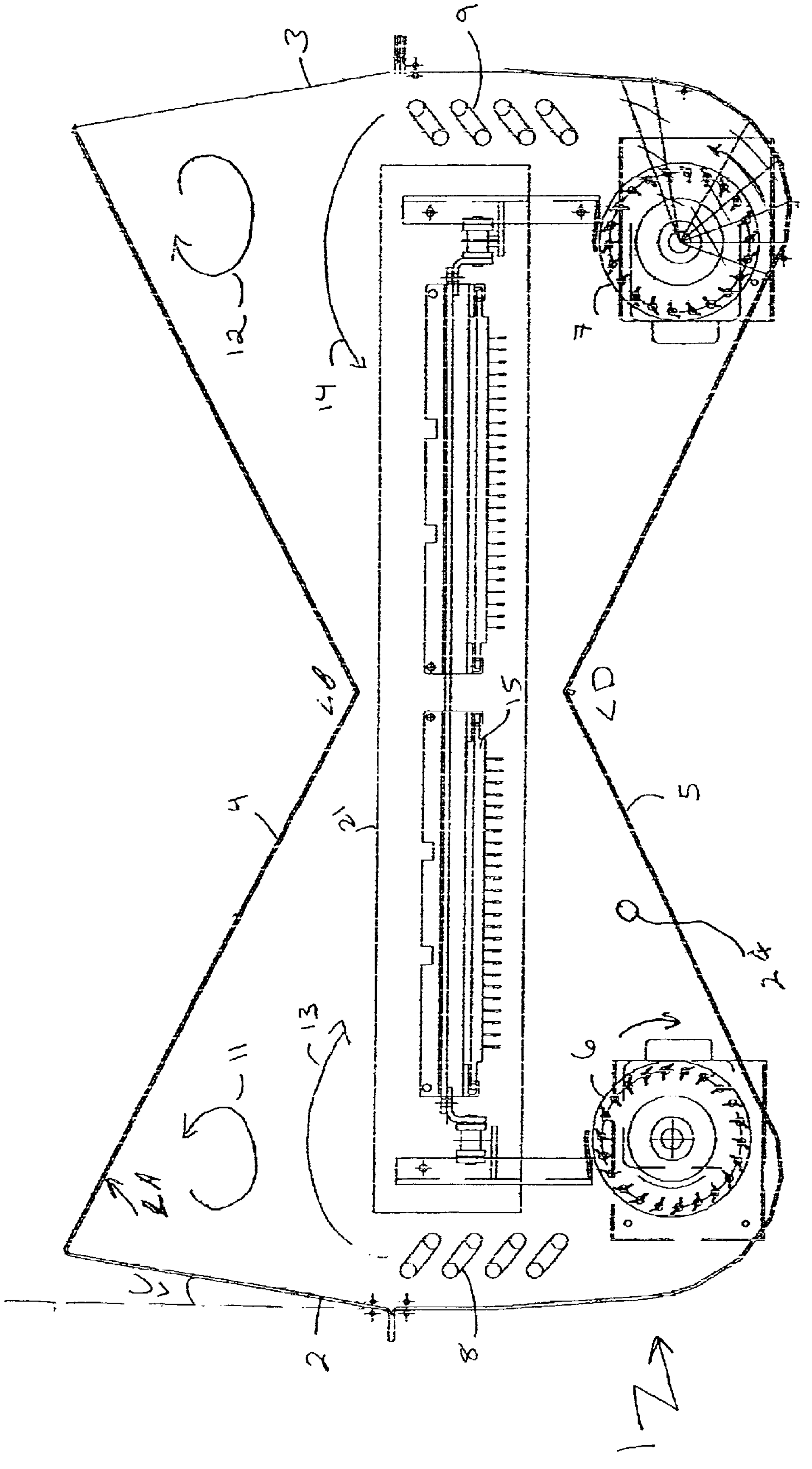
FIG. 1 is a schematic sectional view showing the components of the pyrolysis oven of the invention with the entrance wall removed taken along line 1—1 of FIG. 2.

The pyrolysis oven has a chamber formed by a top, a bottom, a first side wall, a second side wall, an entrance wall and an exit wall. A conveyor transports objects for pyrolysis treatment through an opening in the entrance wall of the oven chamber in the direction of the arrow in FIG. 2. The top and at least one of the side walls meet in an inverted V shape. At the bottom of chamber, adjacent the side wall, below the inverted V shape, at least one cross-flow blower is present. The cross-flow blower rotating clockwise as seen in FIG. 1 creates a flow of oven atmosphere that flows up the inside of the side wall, through means for heating the flow of oven atmosphere. The flow of oven atmosphere meets a vortex of oven atmosphere that is created in the inverted V-shape, which forces the flow of oven atmosphere down onto the objects to be treated. Preferably the side wall and bottom meet in a curve to accommodate the cross-flow blower and to allow a smooth flow of atmosphere up the side wall.

The means for heating may be any suitable means such as, but not limited to, electrically heated coils or steam heated coils, which may be contained in or passed through the walls of the entrance or exit sides. Such heating means are known in the art and any suitable heating means may be used.

A preferred embodiment is illustrated in FIG. 1, which shows the generally designated oven 1 in accordance with the invention. The first side wall 2 and second side wall 3 of the oven are preferably symmetrical. The top 4 of the oven has a V-shape with the connection of the legs of the V running from the front to the back of the oven. The top and first side and top and second side each meet in an inverted V shape. Preferably, the bottom 5 also has a V shape with the connection of the legs of the V running parallel with the connection of the legs of the V of the top of the oven of the top V.

The angles "A" of the V shape between the first side wall 2 and the top 4 and second side wall 3 and bottom 5 are preferably in the range of about 67° to about 77°, most preferably in the order of about 72°. The sidewall preferably is about vertical on the lower part of the oven and angles inward on the upper part of the oven. The angle "C" inward from a line extending the vertical side wall part of the oven and the upper side wall is about 28° to about 32°, preferably about 30°.

The angle "B" between the connecting legs of the V in the top are in the range of about 115° to about 135°, preferably about 125°. The angle "D" between the connecting legs of the V in the bottom are in the range of about 120° to about 140°, preferably about 130°.

Cross-flow blower fans, 6 and 7, are located in the lower sections on either side of the oven. The cross-flow blowers resemble "squirrel cage" blowers used almost universally in air conditioning and heating systems due to their quiet operation. Both types of blowers have a series of blades arranged around the perimeter of a circle and running parallel to the axis of rotation. (See the Fan Handbook, by Frank R. Bleier, 1998, McGraw-Hill, Boston.) As shown in FIG. 1, fan 6 is driven clockwise, while fan 7 is driven counterclockwise by motors not shown.

The operating principles of the two types of blowers are quite different however. The air or other gas passing through a squirrel cage blower enters the fan of the blower axially and passes through the fan blades once, exiting the fan radially. Gases passing through a cross-flow blower, in contrast, pass through the fan blades of the blower twice, both when entering and when exiting the blower radially. See, for example chapter 13, page 13.1, of the Fan Handbook, supra.

An advantage of the cross-flow blower design versus other blower designs is the reduction in volume of ducting. The cross-flow blower may be located within rectangular ductwork without the need for auxiliary or oversized ductwork to convey the air or other gases to the axial input of squirrel cage blowers. See FIGS. 7.7, 7.8, and 7.9 in the Fan Handbook, supra. Cross-flow blowers can be enclosed in a housing not or slightly larger than the ductwork into which they exhaust. This is due to the unique double flow of air or other gas through the fan as depicted schematically in FIG. 13.1, Fan Handbook. The modest size of the fan housing versus the ductwork size may be seen in FIG. 13.2 of the Fan Handbook.

As previously stated, the two cross-flow blowers 6 and 7 rotate in opposite directions, referably on graphite bearings to produce twin flow streams. Each blower rotates in a direction to circulate the atmosphere of the oven in a flow stream, which passes up along the adjacent side wall. The twin flow streams pass through heating coils, 8 and 9. As the atmospheric flow on both sides of the oven continue past the heating coils, vortexes of rotating oven atmosphere 11 and 12 positioned below the inverted "V" on either side of the interior surface of the top 4 is encountered by the circulating oven atmosphere which serves to direct the flows 13 and 14 of the oven atmosphere downward at a uniform rate of flow past the load zone 21 of the oven which contains the objects to be treated by the pyrolysis process.

Figure 2:
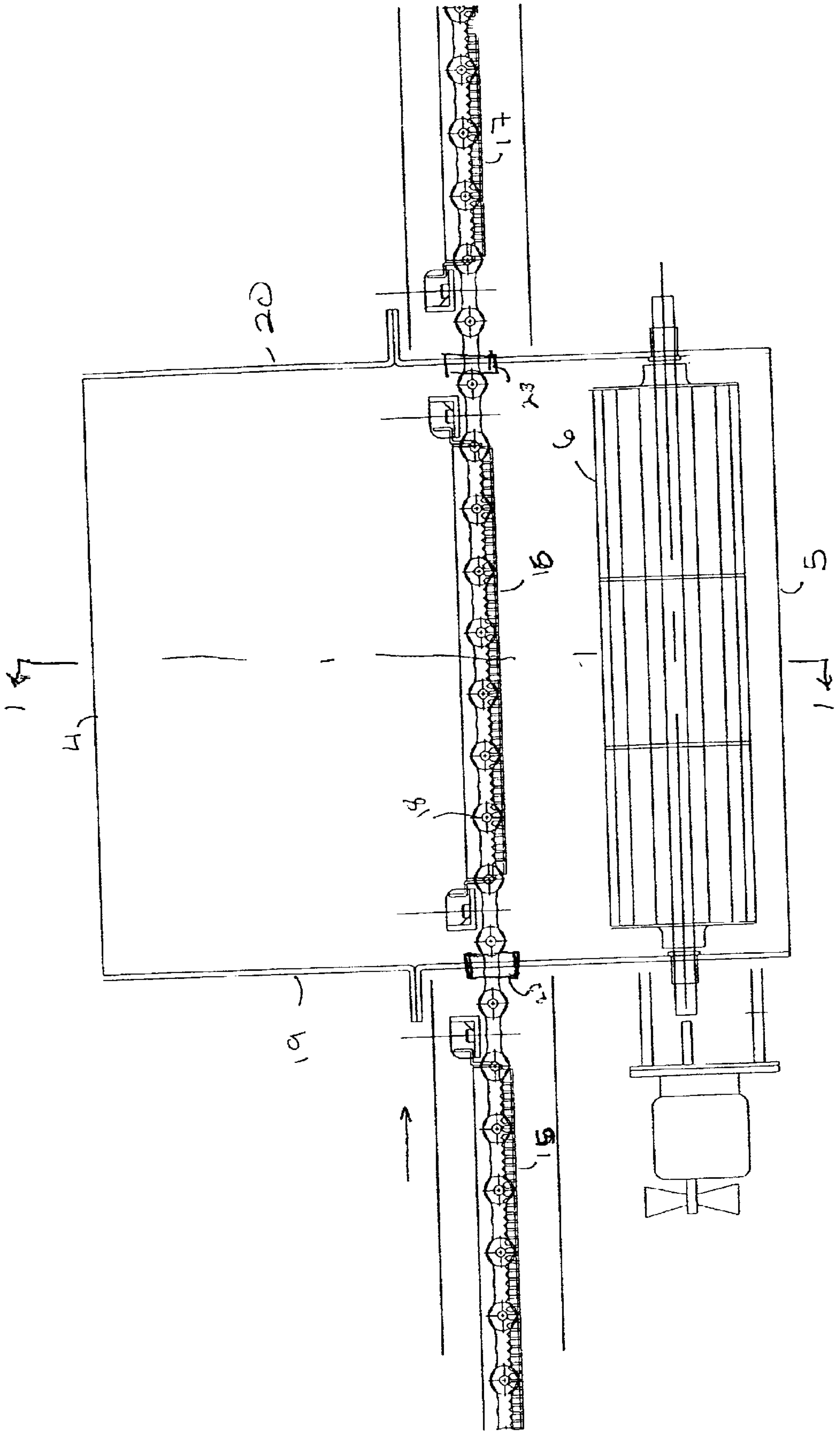
FIG. 2 shows a schematic view of the components of the pyrolysis oven of the invention when viewed with a side wall removed.

FIG. 2 depicts a schematic side view of the oven 1 of the invention with only the cross-flow blower 6 on one side wall and a conveyor 18. The conveyor transports objects to be treated through an opening on the entrance wall and then through the chamber of the oven.

The objects are placed in a process lid, for example. FIG. 2 shows three process lids. Process lid 15 is on the conveyor outside the front 19 of the oven. Process lid 16 is within the oven. Process lid 17 is on the conveyor outside the back 20 of the oven. The objects to be treated may be placed on a single conveyor or a series of conveyers as is within the skill of the art.

The process may be carried out either in continuous or batch processes. If continuous, as shown in FIG. 2, the conveyor may convey the objects into the opening of the entrance wall of the oven, and after treatment, remove the objects through openings in either the entrance wall or exit wall of the oven. The openings may be conventional isolation ports. For example, the conveyor passes through conventional isolation ports 22 and 23 in the entrance and exit walls, respectively. The conveyor may be of any suitable design such as, but not limited to, one or two chains or a belt. The process lids may hang from the chains or rest on the belt. Conveyors, process lids, and other means to convey objects to be treated through an oven are known to those skilled in the art.

The objects may be moved into the oven for the pyrolysis process and back out for dipping in the precursor solutions which give rise to $MnO_2$, etc., during pyrolysis. Alternatively, several ovens may be arranged with a single conveyor chain passing through them with automatic dipping stations located between the ovens. In this manner, the objects may be repeatedly dipped in the precursor solutions and cycled through the pyrolysis steps serially, with the objects being removed from the conveyor after exiting the last pyrolysis oven.

Gas inlet means 24 may be used to inject gases into the chamber to mix with the oven atmosphere. The gas inlet means may be in any suitable location but are preferably near the bottom of the oven near the blowers so that the gases are drawn into the blowers and mixed with the atmosphere of the oven.

Modifications to the oven design of the invention may be made without materially changing the value of the oven. For example, the oven may be equipped with flap doors or guillotine doors (having recessed areas for the conveyor or chains to pass through), with no doors, or with tunnels leading into and out from the oven to minimize oven atmospheric loss. Separate exhaust(s) may be included in the oven design or the ports for loading/unloading the oven may serve to allow gases evolving during pyrolysis (or other processes) to escape. The outer oven side walls, bottom, top, entrance wall, and exit wall may be coated with insulation to help prevent heat loss. The oven may be of separate top and bottom sections welded together or bolted together (with or without gaskets) to facilitate easy access for repairs, etc.

If batch processing is desired, the ports may be sealed and the objects to be treated held on conventional trays during processing.

EXAMPLE 1

In order to demonstrate the efficacy of the oven design of the invention in producing uniform oven atmospheric flow past the load zone, a prototype oven was constructed having the shape shown in FIG. 1 and a volume of 1.3 $ft^3$/lid and 14.5 inches deep. The stainless steel front of the oven was replaced with a ¼" thick polycarbonate plastic 8 having a series of 5⁄16" diameter holes drilled through, both directly above and below the load zone, as well as into the load zone.

The cross flow blower fans were turned on and adjusted (variable speed motors) to provide an oven atmosphere flow rate similar to that used commonly in production pyrolysis ovens (i.e., approximately 300 feet per minute).

An electric anemometer having a probe ¼" in diameter was used to measure the atmospheric flow within the oven by inserting the probe into each of the holes in the polycarbonate plastic sheet. The atmospheric flow through the load zone, above and below the load zone, and from the front to the back of the oven was found to be 300 +/−50 feet per minute.

By comparison, a production oven of conventional design, having baffles and extensive ductwork, was found to have a nominal flow rate of 300 feet per minute but with extremes in flow rate from 110 to over 400 feet per minute.

The inventive oven provided uniform flow better than ovens of conventional construction. The inventive oven had an interior volume of approximately 2.6 cubic feet. The smallest circulating oven atmosphere oven capable of containing two side-by-side process lids of the size used in the inventive oven and also constructed with conventional baffles and circulating fans to give uniform atmosphere flow, had an estimated volume of at least 12–15 cubic feet. Thus the inventive oven design represents a reduction in oven volume, of at least a factor of approximately 5 over prior art technology. Moreover, the amount of oven atmosphere doping chemicals and steam were likewise reduced.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

We claim:

1. A pyrolysis oven comprising a chamber formed by a top, a bottom, a first side wall, a second side wall, an entrance wall and an exit wall, wherein the top and at least one side wall meet in an inverted V shape, wherein the oven further comprises at least a first cross-flow blower situated at the bottom of the chamber adjacent the first side wall such that when the cross-flow blower operates, at least a first flow of oven atmosphere flows up the first side wall of the chamber and meets a first vortex created in the inverted V which first vortex forces the first flow of oven atmosphere over objects to be treated, wherein the oven further comprises first means for heating the at least first flow of oven atmosphere.

2. The pyrolysis oven of claim 1 wherein the top and first side wall meet in a first inverted V shape and the top and second side wall meet in a second inverted V shape, wherein the chamber comprises first and second cross-flow blowers, the first blower located in the bottom of the chamber adjacent the first side wall and the second blower located in the bottom of the chamber adjacent the second side wall such that when the cross-blower blowers operate, a first flow of oven atmosphere flows up the first side wall and meets a first vortex created in the first inverted V which first vortex forces the first flow of oven atmosphere over the objects to be treated and a second flow of oven atmosphere flows up the second side wall of the chamber and meets a second vortex created in the second inverted V which second vortex forces the second flow of oven atmosphere over the objects to be treated.

3. The pyrolysis oven of claim 2 wherein the top comprises two connecting legs formed in a V-shape wherein the bottom of the V transverses the oven from the entrance wall to the exit wall.

4. The pyrolysis oven of claim 3 wherein the angle between the connecting legs of the V are in the range of about 115° to about 135°

5. The pyrolysis oven of claim 3 wherein the bottom comprises two connecting legs in an inverted V-shape wherein the top of the inverted V transverses the oven from the entrance wall to the exit wall.

6. The pyrolysis oven of claim 5 wherein the angle between the connecting legs of the inverted V are in the range of about 120° to about 140°

7. The pyrolysis oven of claim 1 wherein the angles of the V shape between the first side wall and the top is in the range of about 67° to about 77°

8. The pyrolysis oven of claim 2 wherein angles of the V shape between the first side wall and the top and second side wall and bottom are in the range of about 67° to about 77°

9. The pyrolysis oven of claim 1 further comprising a conveyor for transporting objects for pyrolysis treatment through the oven chamber.

10. The pyrolysis oven of claim 2 further comprising a conveyor for transporting objects for pyrolysis treatment through the oven chamber.

11. The pyrolysis oven of claim 1 further comprising said first heating means is adjacent at least the first side wall of the chamber.

12. The pyrolysis oven of claim 11 wherein the first means for heating the flow of oven atmosphere are heating coils.

13. The pyrolysis oven of claim 2 further comprising first means for heating the first flow of oven atmosphere and second means for heating the second flow of oven atmosphere, said first means adjacent the first side wall of the chamber and said second means adjacent the second side wall of the chamber.

14. The pyrolysis oven of claim 13 wherein the first means for heating and second means for heating are each heating coils.

* * * * *